(12) United States Patent
Han

(10) Patent No.: US 7,745,250 B2
(45) Date of Patent: Jun. 29, 2010

(54) IMAGE SENSOR AND METHOD FOR MANUFACTURING THE SAME

(75) Inventor: Jae Won Han, Suwon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 174 days.

(21) Appl. No.: 11/964,415

(22) Filed: Dec. 26, 2007

(65) Prior Publication Data

US 2008/0210982 A1  Sep. 4, 2008

(30) Foreign Application Priority Data

Dec. 27, 2006  (KR) .................. 10-2006-0135759

(51) Int. Cl.
*H01L 29/72* (2006.01)
(52) U.S. Cl. .............. 438/57; 438/67; 438/70; 438/74; 438/75; 438/381; 257/292; 257/440
(58) Field of Classification Search .......... 438/57, 438/70, 74, 75, 381; 257/292, 440
See application file for complete search history.

(56) References Cited

U.S. PATENT DOCUMENTS 6,486,522 B1  11/2002  Bishay et al.

7,547,912 B2 *  6/2009  Osaka et al. .......... 257/40
2006/0165294 A1 *  7/2006  Mizuno et al. ......... 382/224
2008/0070341 A1 *  3/2008  Yuzurihara ............ 438/59

FOREIGN PATENT DOCUMENTS

KR  10-2004-0115972  7/2006

OTHER PUBLICATIONS

U.S. Appl. No. 11/964,304; filed Dec. 26, 2007, Inventor: Jae Won Han (currently pending claims provided)(not yet published).

* cited by examiner

*Primary Examiner*—Edward Wojciechowicz
(74) *Attorney, Agent, or Firm*—Saliwanchik, Lloyd & Saliwanchik

(57) ABSTRACT

An image sensor and manufacturing process thereof are provided. An image sensor according to an embodiment comprises a first wafer formed with a photodiode cell without a microlens and a second wafer formed with a circuit part including transistor and a capacitor. The first wafer is stacked on the second wafer such that a connecting electrode can be used to electrically connect the photodiode cell of the first wafer to the circuit part of the second wafer.

12 Claims, 5 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2006-0135759, filed Dec. 27, 2006, which is hereby incorporated by reference in its entirety.

BACKGROUND

In general, an image sensor, which is a semiconductor device converting an optical image into an electrical signal, is typically classified as a charge coupled device (CCD) or a complementary metal oxide silicon (CMOS) image sensor (CIS).

The CIS device according to the related art includes a photodiode region for receiving a light signal and converting it into an electrical signal, and a transistor region for processing the electrical signal.

Also, the CIS device typically needs one or more capacitors per pixel array.

However, according to the related art, the photodiode region, the transistor region, and the capacitor region are implemented on one wafer during the same fabrication process.

In this case, because the distance from a lens to the photodiode becomes large due to a back-end-of-the-line (BEOL) metal line formed on the transistor region and the capacitor, there is a great loss of the light signal entered into the photodiode region.

Also, according to the related art, because a process is simultaneously performed on the relatively large sized photodiode region and the very small transistor region, a difficulty in a lithography process occurs, which results in many defects occurring, and the photodiode region is attacked in a subsequent process forming a transistor, so that the CIS characteristics would be deteriorated.

Also, according to the related art, as the device becomes smaller using technologies below 90 nm and 65 nm, the size of the capacitor reduces and thus, it becomes more difficult to manufacture the capacitor with a desired capacitance.

Also, according to the related art, since a multi-layer metal line and a capacitor are manufactured together, the distance from a microlens to a photodiode is long, which can result in many problems in manufacturing the microlens.

Also, according to the related art, the transistor region and the capacitor coexist in one CIS device, which results in a region where all of the light incident cannot be absorbed but, rather, is lost.

BRIEF SUMMARY

Embodiments of the present invention provide an image sensor and a method for manufacturing the same, capable of forming a photodiode region on one wafer, manufacturing a transistor and a capacitor on a second wafer, and connecting the respective wafers by means of a system in a package (SiP) process.

An image sensor according to one embodiment comprises: a first wafer provided with a photodiode cell without a microlens; a second wafer provided with a circuit part including transistor and a capacitor; and a connecting electrode electrically connecting the photodiode cell to the circuit part.

Also, a method for manufacturing an image sensor according to an embodiment comprises: providing a first wafer with a photodiode cell without a microlens; providing a second wafer with a transistor and a capacitor; stacking the first wafer on the second wafer; and electrically connecting the photodiode cell to the transistor and the capacitor.

DETAILED DESCRIPTION

Hereinafter, an image sensor and a method for manufacturing the same according to embodiments of the present invention will be described in detail with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

In an embodiment, an efficient scheme for manufacturing an image sensor is provided. The scheme involves separately manufacturing a first wafer with a photodiode cell and a second wafer with a circuit part, and stacking the first wafer and the second wafer. The photodiode cell formed on the first wafer and the circuit part formed on the second wafer can be electrically connected by means of a connecting electrode.

Figure 1:
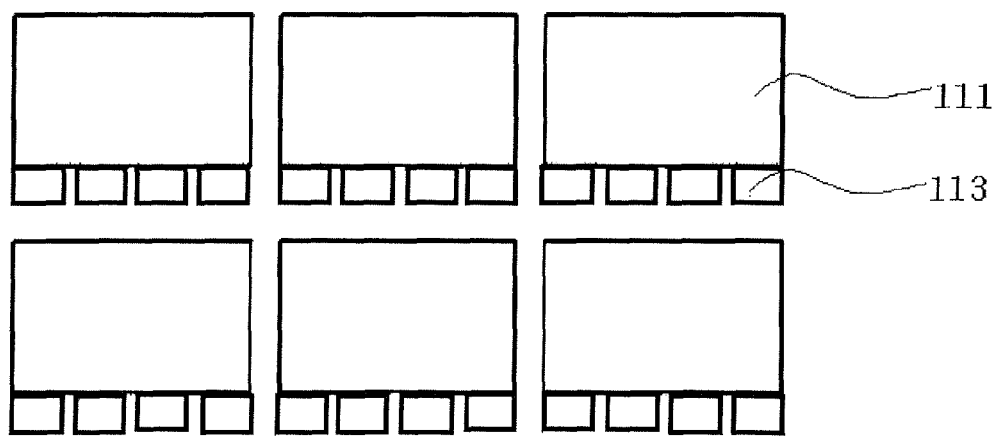
FIGS. 1 to 6 are cross-sectional views of a manufacturing process of a photodiode of an image sensor according to an embodiment of the present invention.
Figure 2:
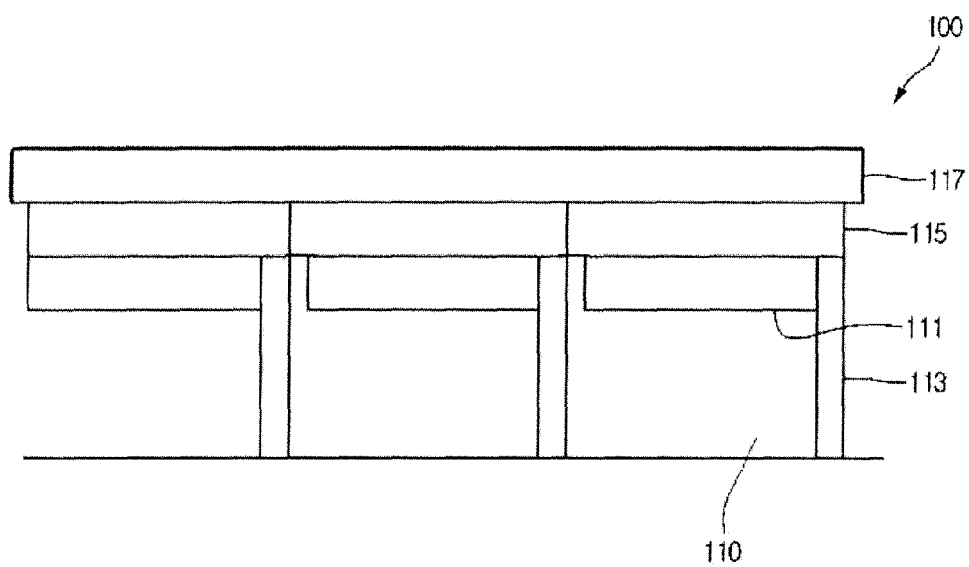

FIG. 1 is a concept view of a wafer provided with a photodiode cell according to an embodiment, and FIG. 2 is a concept view of a cross-section of a wafer 100 provided with a photodiode cell according to an embodiment.

According to a method for manufacturing an image sensor, a first wafer 100 can be manufactured with a photodiode cell 111, a penetrating electrode 113, and a color filter 115.

Figure 3:
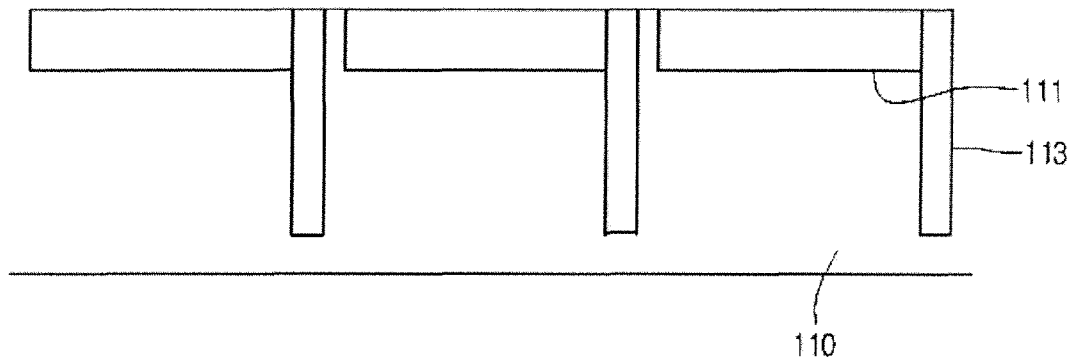

Referring to FIG. 3, a photodiode cell 111 can be formed on an upper region of a semiconductor wafer 110. Then, a penetrating electrode 113 connected to the photodiode cell 111 and penetrating through the semiconductor wafer 110 can be formed.

Accordingly, pixel arrays each configured of only the photodiode 111 for a CIS device can be provided in a design such as shown in FIG. 1.

The pixel arrays can be designed to minimize empty space to reduce the loss of incident light.

The penetrating electrode 113 can be formed by sequentially performing a pattern process, an etching process, and a metal forming process on the semiconductor wafer 110.

The number and placement of the penetrating electrodes 113 can be determined depending on the number of transistors to be used in a pixel. For example, the pixel may be formed having four electrodes 113 for a 2-transistor type CIS and eight electrodes 113 for a 4-transistor type CIS.

A barrier metal (not shown) can be further formed before the metal of the penetrating electrode 113 is deposited. The barrier metal can be formed of a metal thin layer such as, for example, Ti, TiN, Ti/TiN, Ta, TaN, Ta/TaN, TaN/Ta, Co, Co-compound, Co-nitride, Ni, Ni-compound, Ni-nitride, W, W-compound, or W-nitride.

The barrier metal can be formed using, for example, physical vapor deposition (PVD), sputtering, evaporation, laser ablation, atomic layer deposition (ALD), or chemical vapor deposition (CVD).

In one embodiment, the thickness of the barrier metal can be formed in a range of about 20 to 1000 Å.

Thereafter, the penetrating electrode provided with the barrier metal can be filled with a metal layer.

The penetrating electrode 113 may be formed of, for example, W, Cu, Al, Ag, Au, or a combination thereof. The penetrating electrode 113 can be formed by CVD, PVD, evaporation, electro-chemical plating (ECP), ALD, or laser ablation.

In an embodiment, a trench for forming the penetrating electrode 113 can be etched in the substrate 110 to a depth of about 50 to 500 μm, and the critical dimension (CD) of the penetrating electrode 113 can be about 0.5 to 10 μm.

The metal layer for the penetrating electrode 113 can be deposited until the thickness of the metal layer is about 50 to 900 μm based on a flat plane, in other words, until the metal layer completely fills the penetrating electrode and further rises above the surface thereof.

Thereafter, the metal layer remaining on the substrate is removed and cleaned. As the method for removing the metal layer on the substrate, a process such as a chemical mechanical polish (CMP) or etch back can be used. At this time, the metal layer removing process can be performed until the semiconductor wafer 110 is exposed.

Figure 4:
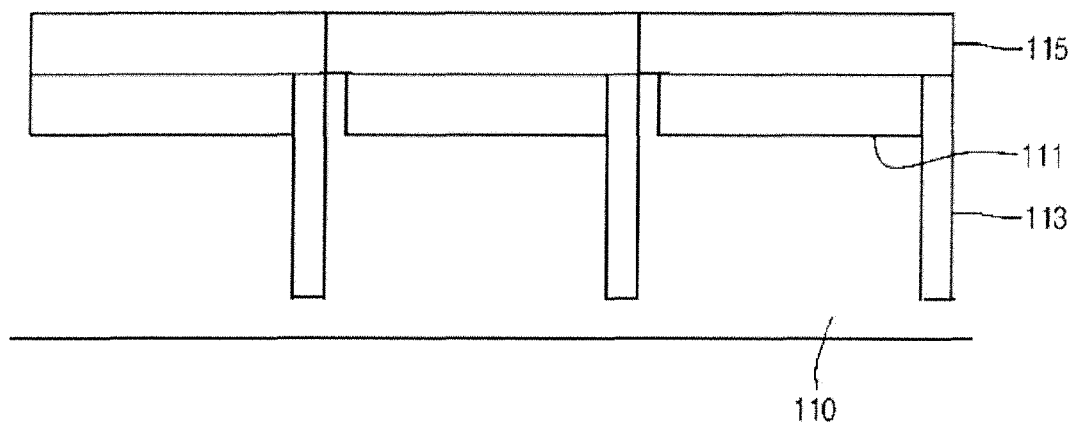

Referring to FIG. 4, a color filter 115 can be formed on the photodiode cell 111.

The manufacturing process of the color filter 115 can include forming red R, green G, and blue B color filters. In one embodiment, the penetrating electrodes 113 are also covered by the color filter 115.

Figure 5:
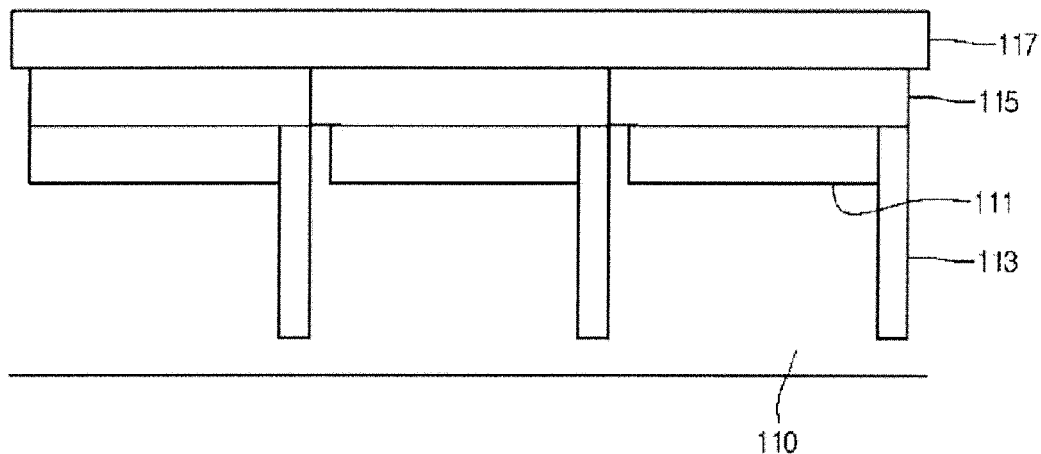

Then, referring to FIG. 5, a protective layer 117 can be formed on the color filter 115.

According to embodiments of the present invention, light is directly incident on the color filter and the photodiode so that a microlens is not needed.

Therefore, a microlens process can be skipped and the protective layer 117 capable of protecting the manufactured photodiode can be deposited.

The protective layer 117 can be formed of, for example, $SiO_2$, BPSG, TEOS, or SiN using various sources. The thickness of the protective layer 117 can be about 0.3 to 5 μm. The protective layer 117 can be deposited using, for example, an electric furnace, a CVD method, or a PVD method.

Figure 6:
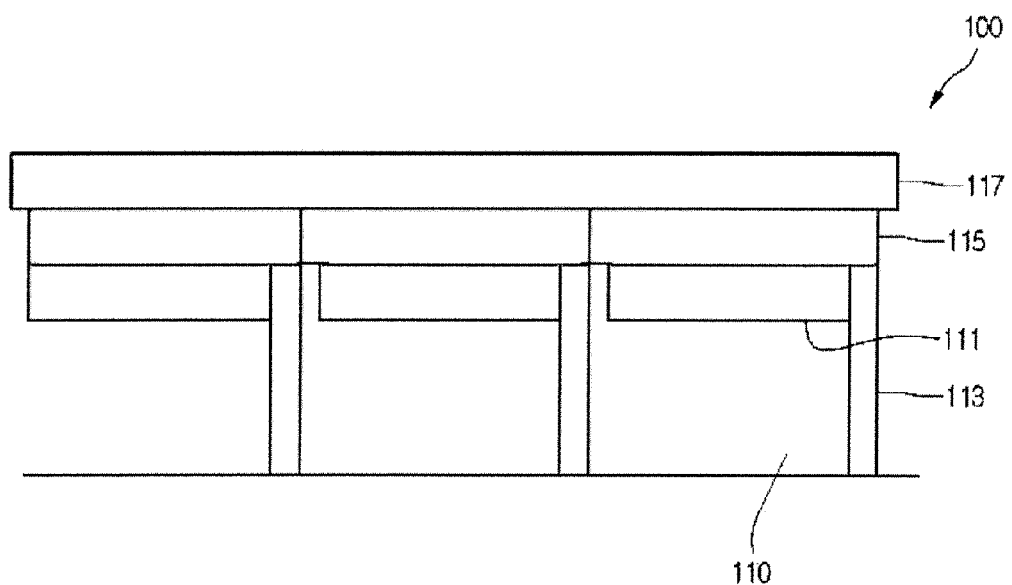

Referring to FIG. 6, the penetrating electrode 113 can be exposed at a back surface of the semiconductor wafer 110.

To expose the penetrating electrode 113 at the lower, or back, side of the semiconductor wafer 110, the semiconductor wafer 110 can be back grinded until the penetrating electrode 113 is exposed at the lower side thereof. The thickness of the semiconductor wafer 110 after being back grinded may be about 50 to 500 μm.

Figure 7:
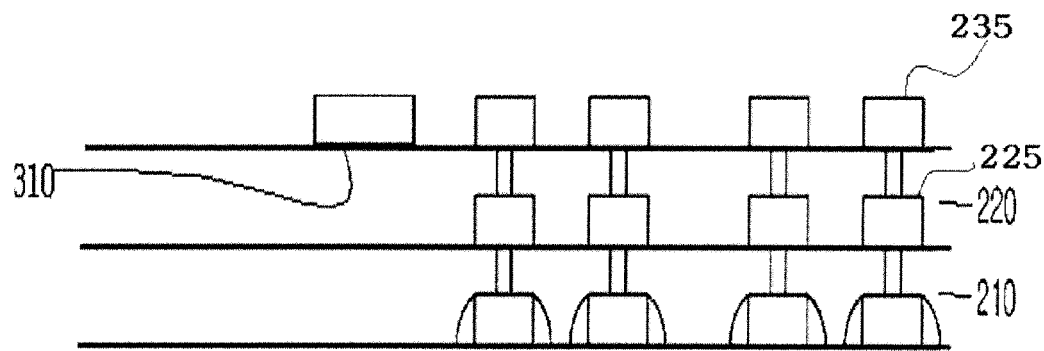
FIGS. 7 and 8 are cross-sectional views of a circuit region of an image sensor according to an embodiment of the present invention.
Figure 8:
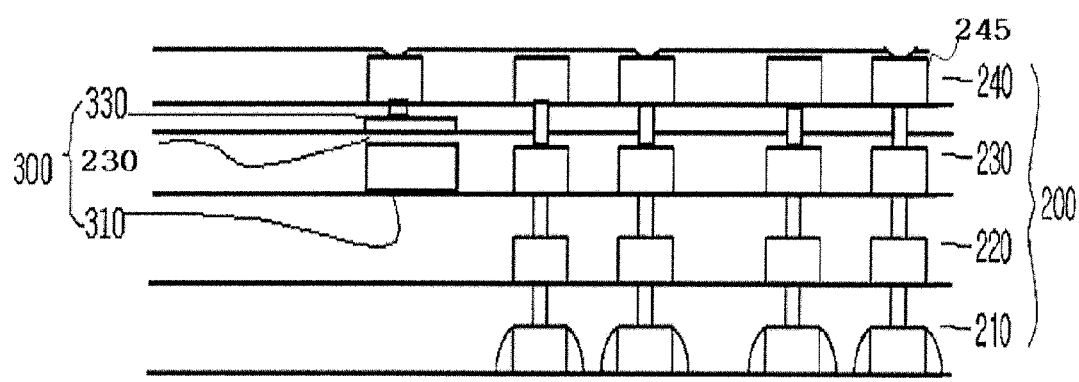

FIGS. 7 and 8 are cross-sectional views of a circuit region of an image sensor according to an embodiment of the present invention.

According to a method for manufacturing an image sensor as shown in FIGS. 7 and 8, a second wafer 200 can be manufactured comprising a transistor layer 210, a first metal layer 220, and a second metal layer 230.

The transistor layer 210 and the first and second metal layers 220 and 230 can form a logic circuit part for signal processing. Herein, the case where the first and second metal layers 220 and 230 are formed is shown by way of example, but the number of the metal layers can be reduced or be further increased depending on the design thereof.

A transistor can be formed on the transistor layer 210 in a region corresponding to a photodiode cell 111 region provided in the first wafer 100. The transistor is formed to correspond to the photodiode cell 111 region and it can be formed as one transistor, two transistors, four transistors, or other various configurations for a unit pixel depending on the need thereof.

Since the region of the photodiode cell 111 can be more largely formed as compared to the related art, there is no need to restrict the number of the transistors to be formed. Accordingly, a degree of freedom capable of forming a great number of transistors in order to improve the characteristics of the image sensor is secured, if necessary. Also, there is no need to use a fine circuit process in order to form the circuit part.

Referring again to FIG. 7, a first metal 225 can formed on a first metal layer 220. Then, in an embodiment, a second metal 235 and a lower electrode 310 of a capacitor can be formed on the first metal layer 220.

At this time, in order to form the second metal 235 and the lower electrode 310, the metal layer can be deposited, patterned, etched and then cleaned.

Also, when forming the second metal 235 and the lower electrode 310, Al, a Ti/TiN/Al/Ti/TiN layer structure, a Ti/Al/Ti/TiN layer structure, a Ti/Al/TiN layer structure, a Ti/TiN/Al/Ti layer structure, a Ti/TiN/Al/TiN layer structure, Cu, or a TaN/Cu/TaN layer structure can be used.

The second metal layer for the second metal 235 and the lower electrode 310 can be deposited, for example, by means of a PVD, an ECP, or a CVD.

Next, referring to FIG. 8, an insulating layer 230 can be formed on the second metal 235 and lower electrode 310.

At this time, the insulating layer 230 on the lower electrode 310 can be used as an insulator of a capacitor. The capacitor can be a metal-insulator-metal (MIM) capacitor.

The insulating layer 230 can be formed of, for example, $SiO_2$, BPSG, TEOS, or SiN using various sources, and can be deposited using, for example, an electric furnace, a CVD method, or a PVD method.

Thereafter, a planarization process on the insulating layer 230 of the deposited capacitor can be performed by means of a CMP or an etch back.

The planarization process can be performed so that the insulating layer on the lower electrode 310 of the capacitor has only the thickness suitable for the capacitor capacity.

In an embodiment, if the control of the thickness of the insulating layer 230 on the capacitor lower electrode 310 is difficult by means of a CMP, an over CMP can be performed and a second insulating layer can be deposited at a suitable thickness, making it possible to secure a desired thickness of the insulating layer on the lower electrode 310. The second insulating layer can be of the same material as the insulating layer 230.

In an MIM capacitor, since capacitance changes depending on the thickness of the insulating layer, the control of the thickness of the insulating layer can be important.

According to an embodiment, the thickness of the insulating layer 230 on the lower electrode 310 of the capacitor is preferably about 5 to 5000 Å. The selected thickness can be determined depending on the capacity size of the capacitor required in a design thereof.

In one embodiment, a CMP can be performed on the insulating layer 230 until the lower electrode 310 is exposed. Then, the thickness of an insulating layer for the capacitor can be controlled by means of the deposition of a second insulating layer.

In other words, a dummy interlayer insulating layer (not shown) may be formed on the lower electrode 310 and the planarization process is performed on the dummy interlayer insulating layer until the lower electrode 310 is exposed. Thereafter, the insulating layer can be formed on the exposed lower electrode 310 at a thickness suitable for the capacitor capacity.

Next, an upper electrode 330 can be formed on the insulating layer 230 of the capacitor.

After a metal layer for the upper electrode 330 is formed, the upper electrode 330 can be patterned, etched, and cleaned.

The upper electrode 330 can include, for example, one or more layers of Ti, TiN, Ta, TaN, Al, Cu, or a combination thereof.

The metal layer of the upper electrode 330 can be deposited by means of, for example, a PVD method, an ECP method, or a CVD method.

Next, an upper interlayer dielectric layer 231 can be formed on the upper electrode 330.

The upper interlayer dielectric layer 231 formed on the upper electrode 330 can be deposited using, for example, $SiO_2$, BPSG, TEOS, or SiN, by means of, for example, an electric furnace, a CVD method, or a PVD method.

Next, a top metal layer 240 including a top metal 245 can be formed on the upper interlayer dielectric layer 231.

The top metal layer 240 can be formed on the upper interlayer dielectric layer by performing a pattern process, an etching process, and a wire formation process. Alternatively, the top metal 245 can be formed by performing a deposition process, patterning process, and etching process, and then the top metal 245 can be covered by an insulating layer.

A protective layer 240 can be provided on the top metal layer 240 and a pad area can be opened through the protective layer to expose selected top metal 245.

At this time, the pad opening can be formed in positions corresponding to the exposed penetrating electrode 113.

Figure 9:
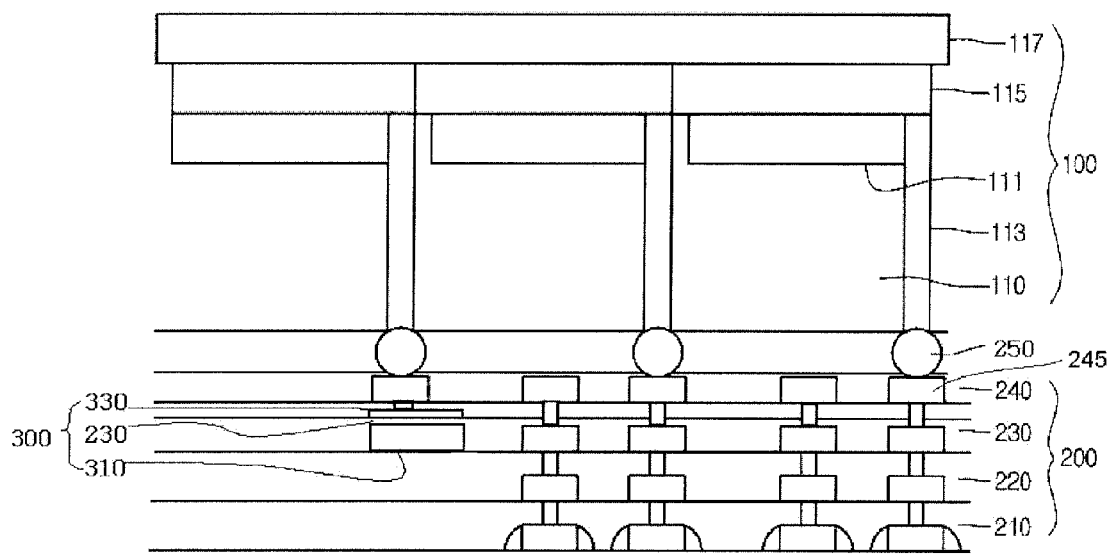
FIG. 9 is a cross-sectional view of an image sensor according to an embodiment of the present invention.

Next, referring to FIG. 9, the first wafer 100 and second wafer 200 can be stacked.

The image sensor according to an embodiment comprises a first wafer 100, a second wafer 200, and a connecting electrode 250.

The connecting electrode 250 connects a photodiode cell 111 formed on the first wafer 100 to a circuit part formed on the second wafer 200. The connecting electrode 250 is electrically connected to the photodiode cell 111 through a penetrating electrode 113 formed on the first wafer 100. The connecting electrode 250 is electrically connected to a top metal in the top metal layer 240 of the circuit part.

With the image sensor according to an embodiment of the present invention, the circuit part is not positioned on the photodiode cell 111. In addition, since the photodiode cell 111 can be directly exposed to the light from an external source without additional obstacles, the image sensor has an advantage that a separate microlens is not required.

With an image sensor and a method for manufacturing the same according to an embodiment as described above, since the image sensor can be manufactured as a system in a package (SiP), the interlayer dielectric layer such as an oxide film or the metal line layer is not formed on the photodiode of the CIS so that path of light is short and the loss of light is thus little, making it possible to provide a CIS device of high image quality.

Also, the photodiode process can be performed isolated from the capacitor and the capacitor manufacturing process, having an effect capable of manufacturing a high performance photodiode without an attack of a subsequent process.

Also, since there are no interlayer dielectric layers IMD and metal lines on the photodiode region, a microlens is not required for condensing light to the photodiode so that the manufacturing process can be faster and more economical.

In addition, since a transistor for the logic circuit can be made in a space as wide as the photodiode region, there is no restriction in the number of the transistors so that many transistors can be integrated, having an effect capable of implementing a high quality and a high characteristics image sensor.

Furthermore, the capacitor can be made in the transistor region, making it possible to manufacture a high performance image sensor without a loss of light in the photodiode region.

Also, a CIS device capable of using a capacitor having various capacitances can be implemented, having an effect capable of improving the performance of an image sensor.

In addition, according to embodiments of the present invention, there is no transistor and capacitor region on the upper side of the photodiode region, having an effect capable of reducing the number of metal layers.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
    providing a first wafer provided with a photodiode cell without a microlens, wherein providing the first wafer provided with the photodiode cell without the microlens comprises:
        forming the photodiode cell on a first semiconductor substrate of the first wafer;
        forming a penetrating electrode in the first semiconductor substrate and connected to the photodiode cell; and
        forming a color filter on the photodiode cell and the penetrating electrode;
    providing a second wafer provided with a transistor and a capacitor;

stacking the first wafer on the second wafer; and electrically connecting the photodiode cell to the transistor and the capacitor.

2. The method according to claim 1, wherein the photodiode cell and the circuit part are electrically connected through a connecting electrode.

3. The method according to claim 1, wherein providing the first wafer provided with the photodiode cell without the microlens further comprises exposing the penetrating electrode at a lower side of the first wafer after forming the color filter.

4. The method according to claim 1, wherein electrically connecting the photodiode cell to the transistor and the capacitor uses a connecting electrode electrically connected to the photodiode cell through the penetrating electrode.

5. The method according to claim 1, wherein the penetrating electrode comprises W, Cu, Al, Ag, or Au.

6. The method according to claim 1, wherein providing the first wafer provided with the photodiode cell without the microlens further comprises forming a barrier metal between the first semiconductor substrate and the penetrating electrode.

7. The method according to claim 6, wherein the barrier metal is formed of Ti, TiN, Ti/TiN, Ta, TaN, Ta/TaN, TaN/Ta, Co, Co-compound, Co-nitride, Ni, Ni-compound, Ni-nitride W, W-compound, or W-nitride.

8. The method according to claim 1, wherein providing the second wafer provided with the transistor and the capacitor comprises:

forming a transistor on a first region of a second semiconductor substrate of the second wafer;

forming a metal line on the second wafer provided with the transistor and forming a lower electrode of the capacitor on a second region of the second semiconductor substrate of the second wafer provided with the transistor;

forming an interlayer dielectric layer on the metal line and the lower electrode; and forming an upper electrode on the interlayer dielectric layer on the upper side of the lower electrode.

9. The method according to claim 8, wherein after the step of forming the upper electrode, the providing the second wafer provided with the transistor and the capacitor further comprises:

forming an insulating layer over the second wafer provided with the upper electrode;

forming a top electrode on the insulating layer;

forming a protective layer on the top electrode; and forming a pad opening through the protective layer.

10. The method according to claim 9, wherein the pad opening is formed in the second wafer to correspond to a position of an exposed penetrating electrode of the first wafer.

11. The method according to claim 8, wherein forming the interlayer dielectric layer on the metal line and the lower electrode comprises:

forming an initial interlayer dielectric layer on the metal line and the lower electrode; and performing a planarization process until the initial interlayer dielectric layer has a thickness suitable for the capacitor capacity.

12. The method according to claim 8, wherein forming the interlayer dielectric layer on the metal line and the lower electrode comprises:

forming a dummy interlayer dielectric layer on the metal line and the lower electrode;

performing a planarization process on the dummy interlayer dielectric layer until the lower electrode is exposed; and forming a second interlayer dielectric layer at a thickness suitable for the capacitor capacity on the exposed lower electrode.

* * * * *